(12) United States Patent  (10) Patent No.: US 6,476,704 B2
Goff  (45) Date of Patent: Nov. 5, 2002

(54) MMIC AIRBRIDGE BALUN TRANSFORMER

(75) Inventor: Miles E. Goff, Carlisle, MA (US)

(73) Assignee: The Raytheon Company, Lexington, MA (US)

( * ) Notice: Subject to any disclaimer, the term of this patent is extended or adjusted under 35 U.S.C. 154(b) by 0 days.

(21) Appl. No.: 09/901,530

(22) Filed: Jul. 9, 2001

(65) Prior Publication Data

US 2001/0035809 A1 Nov. 1, 2001

Related U.S. Application Data

(63) Continuation of application No. 09/443,641, filed on Nov. 18, 1999.

(51) Int. Cl.$^7$ .............................................. H01F 5/00
(52) U.S. Cl. .................. 336/200; 336/232; 336/223; 29/602.1; 29/606
(58) Field of Search ................................. 336/182, 200, 336/223, 232, 186, 187; 29/602.1, 606, 605

(56) References Cited

U.S. PATENT DOCUMENTS

| | | |
|---|---|---|
| 5,095,357 A | 3/1992 | Andoh et al. .................. 357/51 |
| 5,610,433 A | 3/1997 | Merrill et al. .............. 257/531 |
| 6,380,608 B1 * | 4/2002 | Bentley ...................... 257/531 |

* cited by examiner

Primary Examiner—Anh Mai
(74) Attorney, Agent, or Firm—Foley Hoag LLP

(57) ABSTRACT

A balun transformer and inductor are proposed having geometries that provide several windings of conductors in small areas. In one embodiment, the windings of the balun transformer and inductor have octagonal shapes with a lower and upper layer of wound conductors. The upper layer lies on supporting posts that stand on pedestals. The lower layer of conductors shadow the upper layer while curving to avoid the pedestals.

44 Claims, 4 Drawing Sheets

MMIC AIRBRIDGE BALUN TRANSFORMER

This application is a continuation of U.S. patent application Ser. No. 09/443,641 filed on Nov. 18, 1999. The contents of the aforementioned application is hereby incorporated by reference.

FIELD OF THE INVENTION

This application relates to the field of electronics and more particularly to monolithic microwave integrated circuit (MMIC) balun transformers.

BACKGROUND OF THE INVENTION

Transformers are electric devices that transfer electric energy from one alternating-current circuit to one or more other circuits to increase (step-up) or diminish (step-down) the voltage. This transfer of energy is accomplished through electromagnetic mutual induction: a time varying current through the primary conductor produces a time varying magnetic flux through the secondary conductor. As a consequence of Faraday's Law of Induction, this changing flux induces an electromotive force (emf) in the secondary conductor that gives rise to a current. The voltage in the secondary conductor is typically given by the ratio of the number of windings of the secondary conductor to the number of windings in the primary conductor multiplied by the voltage of the primary conductor. If this so-called turn's ratio is greater than unity, the result is a step-up transformer that augments the primary voltage; if it is less than unity the result is a step-down transformer.

Balun transformers, devices for matching an unbalanced line (coax) to a balanced load (e.g., an antenna), have various applications. For example, modern wireless communications products such as cellular telephones, satellite receivers, and pagers require balun transformers to change from single ended to differential circuit forms in critical circuit functions such as balanced mixers. Balun transformers are needed to change impedence levels between stages while maintaining DC isolation between stages of a differential circuit. Balun transformers also find use in transmitters, providing signal isolation between local oscillators and radio frequency (RF) and intermediate frequency (IF) sections of a balanced upconverter, or coupling output pagers require balun transformers to change from single ended to differential circuit forms in critical circuit functions such as balanced mixers. Balun transformers are needed to change impedence levels between stages while maintaining DC isolation between stages of a differential circuit. Balun transformers also find use in transmitters, providing signal isolation between local oscillators and radio frequency (RF) and intermediate frequency (IF) sections of a balanced upconverter, or coupling output stages of a push-pull power amplifier. Other applications include discriminators, phase detectors, and antenna feeds.

It is desirable to perform the function of a balanced transformer with a high degree of electrical symmetry to maintain circuit isolation, and to provide broadband frequency response. It is also advantageous that these performance features be achieved with a device that is compatible with other components manufactured in monolithic microwave integrated circuit (MMIC) form, to achieve integration of balanced circuits.

MMIC balun transformers have been made in the past by first placing the primary and secondary conductors beside each other on the surface of a GaAs substrate, and then wrapping up this structure to produce a two-conductor spiral as shown below in FIG. 2. However, a problem arises with this approach because both conductors are in intimate contact with the substrate. As a result, this coplanar geometry gives rise to substantial inter-winding capacitance, which limits the operating bandwidth of the device. This effect is most dramatic in step up transformer applications, which employ a high secondary impedance level, and is most sensitive to stray capacitive loading effects. Trying to overcome this problem by increasing the spacing between the conductors to reduce the capacitance has the drawback of increasing the area occupied by the transformer, and also reducing the magnetic coupling coefficient between the primary and secondary conductors. Moreover, these known approaches do not give rise to the symmetrical circuits important in balanced devices such as upconverters, downconverters, and frequency multipliers. Taking a different tack of using active circuit techniques to develop balanced signals gives rise to other problems including consuming precious battery current, injecting noise, and not exhibiting true broadband symmetry.

As mentioned above, transformers rely on the principle of mutual inductance whereby a changing current in a primary conductor gives rise to an emf in a secondary conductor. Inductors, on the other hand, which only have a single conductor, rely on self inductance to operate, and are important electronic devices in their own right. The most common type of inductor consists of a single coil of a conductor, the windings of which are tightly packed together along the surface of a cylinder. The tightly wound turns of the conductor help increase the inductance: each of the windings contributes an emf and also contributes to the magnetic flux through the coil. Hence, increasing the number of windings by a factor of N increases the self-inductance by a factor of $N^2$. Thus, any innovation that can pack more windings into less space would give rise to a more desirable inductor. It is desirable to reduce the inter winding capacitance between the turns of an inductor to increase its self resonant frequency, and thusly increase the bandwidth over which the component behaves substantially as an inductor.

SUMMARY OF THE INVENTION

The invention addresses the aforementioned problems by providing balun transformers that place the secondary windings of the transformer above the primary windings on supporting posts. In one particular embodiment, the balun transformers described herein have two tiers of octagonal windings, one mounted on top of the other. The technology used to achieve this configuration is the same MMIC technology commonly used for crossovers. This MMIC technology is well established and can be found, for example, in many GaAs foundries used to make contacts to the top plate of thin film capacitors. Thus, no costly processing steps employing additional insulating layers (and increasing the primary to secondary capacitance) are required to realize the benefits of a symmetrical balun transformer.

With minor modifications, the present invention can also result in an inductor. In particular, by connecting the primary and secondary conductors in series, the result is a new inductor that is able to pack an increased number of windings into a defined, small area leading to desirable electronic characteristics, such as large inductances. Often, increasing the number of windings by a factor of N, increases inductive effects by a factor of $N^2$, as is the case for the common inductor, composed of a close-packed helical coil, which can be formed by tightly winding a conducting wire around a cylinder's surface. For such an inductor, it is well known that the inductance is given, in MKS units, by $\mu n^2 lA$, where $\mu$ is the permeability constant, n is the number of windings per unit length, and 1 and A are the length and cross-sectional area of the coil, respectively. Thus, being able to pack more windings in a given volume can be expected to yield significant increases in the inductance.

More particularly, the systems described herein can include balun transformers having primary and secondary conductors, with a dielectric in between, such that each of the conductors lies in different, but parallel planes. The conductors have windings to promote the exchange of electromagnetic energy via mutual inductance. The system described herein can also include a balun transformer having an approximately planar secondary conductor, such that the secondary conductor has a large inductance arising from winding the secondary conductor in a relatively small volume of space that provides more effective flux linkages.

In various embodiments, the secondary conductor can be supported by posts standing on pedestals, the dielectric can be air, the windings of the primary conductor can be wider than those of the secondary conductor, or curve beneath the secondary conductor to avoid the pedestals, and the primary and secondary conductors can be separated by a gap of the order of a micron ($10^{-6}$ meters). The secondary conductor can include windings along concentric polygons, such as octagons, or circles, with crossover points between adjacent tracks.

The systems described herein can also include inductors having upper, secondary and lower, primary conductors electrically connected in series, and separated by at least one dielectric, such that the lower, primary and upper, secondary conductors lie substantially on parallel planes and have more than one winding of a conductor.

In various embodiments, the inductor can have an upper, secondary conductor that lies on supporting posts on pedestals. The inductor can have a lower, primary conductor that both curves beneath the upper, secondary conductor so as to avoid the pedestals, and windings that are wider than windings of the upper, secondary conductor. The dielectric between the lower, primary and upper, secondary conductors can be air, silicon nitride, or polyimide, for example.

Described herein is also a method for making balun transformers including laying a planar primary conductor below a planar secondary conductor, and leaving a gap between the first and second conductors that can be filled with a dielectric.

In variants of the method, the secondary conductor can lie on supporting posts on pedestals, the primary conductor can have windings that are wider than those of the secondary conductor, and curve beneath the secondary conductor so as to avoid the supporting posts, and the dielectric can be air.

Described herein is also a method for making inductors which involves laying a substantially planar lower, primary conductor next to a substantially planar upper, secondary conductor, connecting the lower, primary and upper, secondary conductors in series, leaving a gap between the lower, primary and upper, secondary conductors, and providing at least one dielectric to reside in the gap.

In variants of the method, the upper, secondary conductor lies on supporting posts on pedestals, and the lower, primary conductor, which can have windings that are wider than those of the upper, secondary conductor, curves beneath the upper, secondary conductor in order to avoid the pedestals. The dielectric separating the two conductors can be air.

Additionally, a method of compactly winding a secondary conductor for a balun transformer is described herein. The method involves coiling the conductor along concentric polygons or circles substantially in a plane, and providing crossovers to adjacent tracks.

In variants of the method, the polygons can be octagons, the crossover points can occur at every half revolution of the polygons, and the secondary conductor can lie on posts standing on pedestals. In addition, the method can include disposing a primary conductor beneath the secondary conductor wherein the primary conductor substantially shadows the windings of the secondary conductor from the ground plane on the underside of the MMIC chip and curves to avoid the pedestals.

Benefits of the described invention include reduction in chip area with a concomitant reduction in price; increase in performance by increasing bandwidth, reduction in gain/power variations with frequency, improvements in balance and spurious signal output; new products, such as broadband, general purpose frequency converters; and simplification and performance enhancements of system level products with improved balance in mixers leading to fewer spurious signals, and a reduction in requirements for high Q external filters and a simplification in frequency plans for broadband radios.

BRIEF DESCRIPTION OF DRAWINGS

The following figures depict certain illustrative embodiments of the invention in which like reference numerals refer to like elements. These depicted embodiments are to be understood as illustrative of the invention and not as limiting in any way.

DETAILED DESCRIPTION OF THE ILLUSTRATED EMBODIMENTS

To provide an overall understanding of the invention, certain methods, systems and devices will be discussed with reference to the application of balun transformers and inductors. However, it will be understood by persons of ordinary skill in the art that the general methods, systems and devices described herein are equally applicable to all cases in which transformers and inductors are used in electrical circuits. These applications can include cellular telephones, satellite receivers, pagers, radio and television transmitters, and wherever LC or LR circuits are to be found. Other uses of the invention can be made without departing from the scope of the invention.

Figure 1:
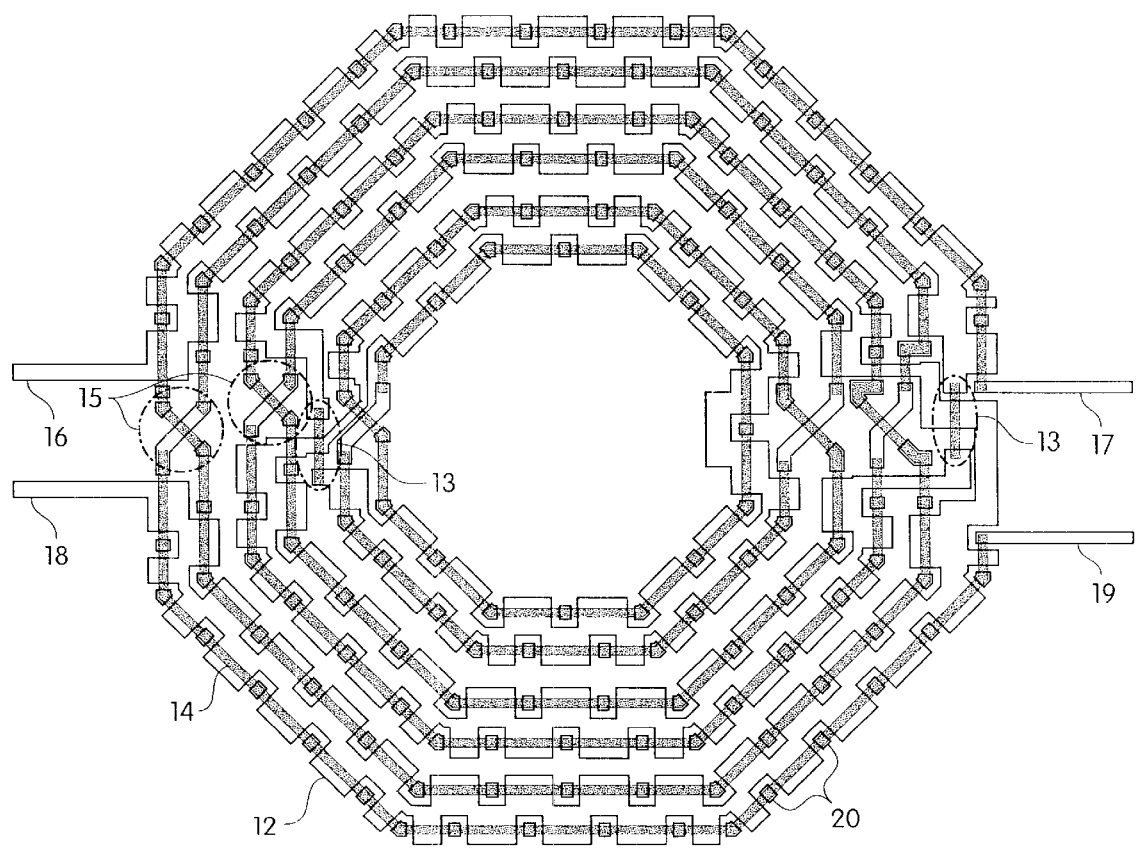
FIG. 1 shows an overhead view of one airbridge balun transformer of the type described herein.

FIG. 1 shows an overhead view of an airbridge balun transformer. Primary conductor 12, with two leads 16 and 18, usually lies below secondary conductor 14 with leads 17 and 19. In particular, while most of the windings of the primary conductor lie in a lower layer, these windings sometimes extend to an upper layer. This occurs at the primary crossovers 13, where an electrical connection rises vertically from the lower layer, extends horizontally along the upper layer and drops down again vertically to complete the electrical connection of the primary conductor 12. The secondary conductor 14 sits on posts (not shown) standing on pedestals 20. The secondary conductor 14 also possesses secondary crossovers 15, which permit the circuit to traverse from one winding of the secondary conductor 14 to a nearby winding of the secondary conductor 14. Each of the secondary crossovers 15 forms an "X" with the dark leg of the "X" lying in the upper layer, while the white leg of the "X" lies in the lower layer. This color code is used consistently throughout FIG. 1 (and FIG. 4, below): white elements lie on the lower level, while dark elements lie in the upper level. In the overhead view that is FIG. 1, a white leg of the "X" forming a secondary crossover 15 overlaps with portions of an inner and outer winding of the upper conductor. Here, the lower, white leg is electrically connected to the upper, dark portions by vertical posts (not shown). Similar considerations apply to the leads 17 and 19, which are provided on the lower layer and are electrically connected to the upper, secondary conductor 14 by vertical posts (not shown).

Figure 2:
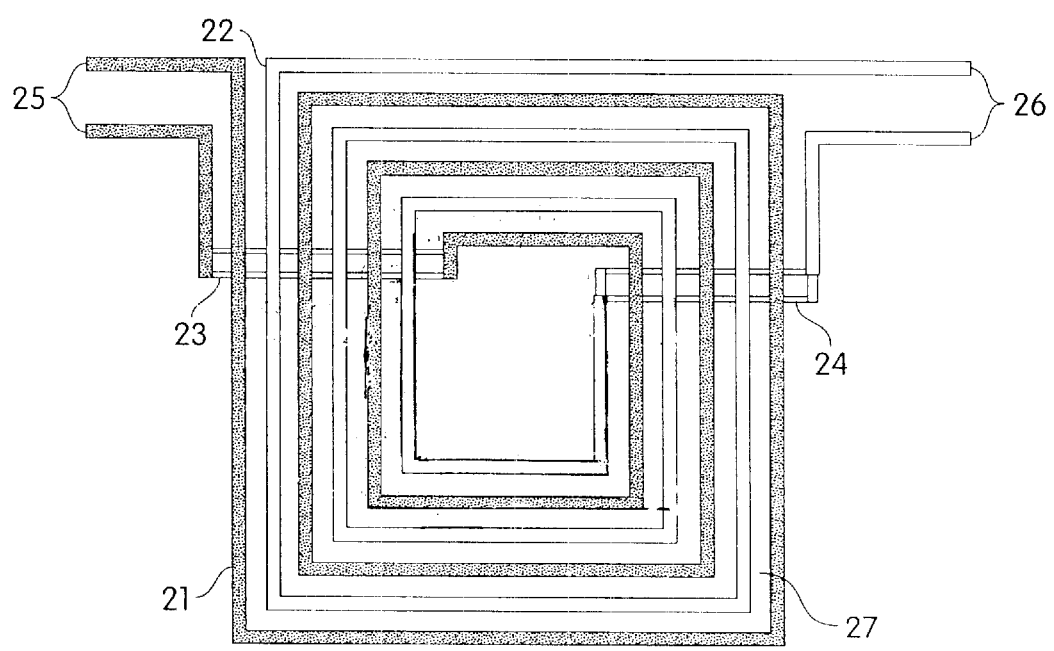
FIG. 2 depicts a coplanar MMIC transformer of the prior art.

FIG. 2 shows an overhead view of a coplanar MMIC transformer of the prior art. Primary conductor 21 and secondary conductor 22 are interwound to form a transformer. The primary 21 and secondary 22 conductors are separated by a GaAs substrate 27. Underpasses 23 and 24 connect the inside ends of the conductor to the outside leads 25 and 26.

The configuration employed in FIG. 1, termed an airbridge, places for the most part the windings of the secondary conductor 14 above the windings of the primary conductor 12 on supporting posts (not shown) standing on pedestals 20, using the same monolithic microwave integrated circuit (MMIC) technology commonly used for crossovers. The term airbridge arises because the dielectric separating the primary conductor 12 and the secondary conductor 14 can be air, except where the posts rise from the lower layer to meet the secondary conductor 14. In FIG. 1, for each of the three windings of the primary conductor 12, two windings of the secondary conductor 14 are placed above resulting in a two-to-one turns ratio. Therefore, this particular configuration steps up the voltage. The path of the primary conductor 12 curves beneath the upper layer comprising the secondary conductor 14 to avoid the supporting pedestals 20. The primary conductor 12 is made wider than the overhead secondary conductor 14 to allow for increased current carrying capabilities.

The octagonal shape seen in FIG. 1 allows three turns of the primary winding and six turns of the secondary winding to be accomplished with only two layers of material. The windings of the secondary conductor 14 hop over tracks after every half turn via secondary crossovers 15, so that the path of the currents flowing in the winding always produces magnetic fluxes which substantially add. It should be noted that the ratio of secondary to primary windings (turns ratio), which determines by how much the primary voltage is stepped up (or down) to the secondary voltage, can be altered as desired.

The primary conductor 12, the lower layer connections, and the pedestals 20, are all formed at the same time using ordinary first metal MMIC processing technology. The posts, as well as the upper layer secondary conductor 14, are all formed at the same time using ordinary airbridge NMIC processing technology. The spacing between the lower and upper layers can be a few microns. The leakage inductance of the configuration used here is much less than the prior art shown in FIG. 2, since nearly all of the magnetic flux lines produced by the windings of the primary conductor 12 are captured by the secondary conductor 14 owing to the close proximity of the conductors. The shielding effect of the windings of the primary conductor 12 in preventing secondary capacitance to ground also aids in the broadband operation of the balun.

Since the primary 12 and secondary conductors 14 in the MMIC airbridge balun transformer are separated by air, rather than the GaAs 27, as in the prior art shown in FIG. 2, the primary to secondary stray capacitance is greatly reduced, which increases the operating frequency range, or bandwidth of the device. Another feature contributing to the enhanced bandwith of this configuration is the low value of primary and secondary leakage inductances, caused by the tight coupling of closely spaced conductors. An operational bandwidth in excess of two octaves may be achieved.

A grounded center tap for the windings of the secondary conductor 14 is accomplished by inserting a via in the center of the structure and making contact with it. DC isolation between the primary and secondary circuits is provided by the separation of the primary 12 and secondary 14 conductors. The stray coupling to ground is symmetrical for both sides of the secondary for all or substantially all frequencies, owing to the symmetry of the structure and the nature of magnetic coupling. This feature is conducive to the realization of high dynamic range mixers and modulators, as well as ultra linear push-pull amplifiers, which depend on circuit symmetry to cancel interfering tones.

If one follows the secondary circuit starting from the right lead 17, the first half turn is along the outer perimeter. After the first half turn, at the center of the left side of FIG. 1, the winding of the secondary conductor 14 crosses over to the inside track adjacent to the outer one. After another half turn, the winding of the secondary conductor 14 once again crosses over to the next inner track. These secondary crossovers 15 continue after each half turn until the winding is in the inner most track. If one now continues to follow the winding, it can be noticed from FIG. 1 that after each half turn, the winding crosses over to the next outer track, and so on until the winding of the secondary conductor 14 becomes the lead 19. The turns of the secondary are arranged to conduct current in predominantly the same direction about an axis perpendicular to the surface of the MMIC in such a way as to have their magnetic fluxes add. In this manner, the balun transformer can be obtained.

Figure 3:
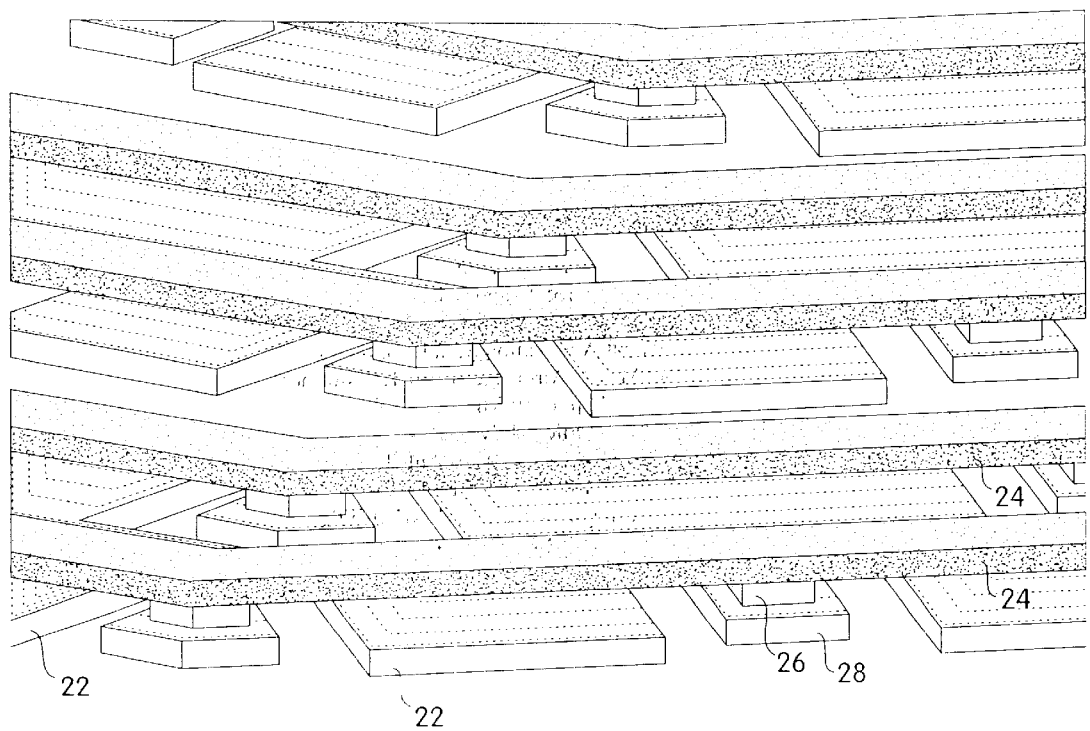
FIG. 3 shows a close up side view of a corner of the balun transformer depicted in FIG. 1.

FIG. 3 shows a close up side view of a corner of the balun transformer depicted in FIG. 1. Primary conductor 22 lies below secondary conductor 24. The secondary conductor 24 rests on supporting posts 26 that stand on pedestals 28. The shape employed places the windings of the secondary conductor 24 on top of the windings of the primary conductor 22 on supporting posts 26 standing on pedestals 28, using the same monolithic microwave integrated circuit technology commonly used for crossovers. The dielectric separating the primary conductor 22 and the secondary conductor 24 can be air, silicon nitride, or polyimide, for example, except where the posts 26 rise from the lower layer to meet the secondary conductor 24. For each of the three windings of the primary conductor 22, two windings of the secondary conductor 24 are placed above resulting in a two-to-one turns ratio. This particular configuration steps up the voltage by an approximate factor of two. The path of the primary conductor 22 curves below the upper layer comprising the secondary conductor 24 to avoid the pedestals 28. The primary conductor 22 is fabricated wider than the overhead secondary conductor 24 to allow for increased current carrying capabilities, and to shield the secondary conductor from the ground plane located on the underside of the MMIC chip.

Figure 4:
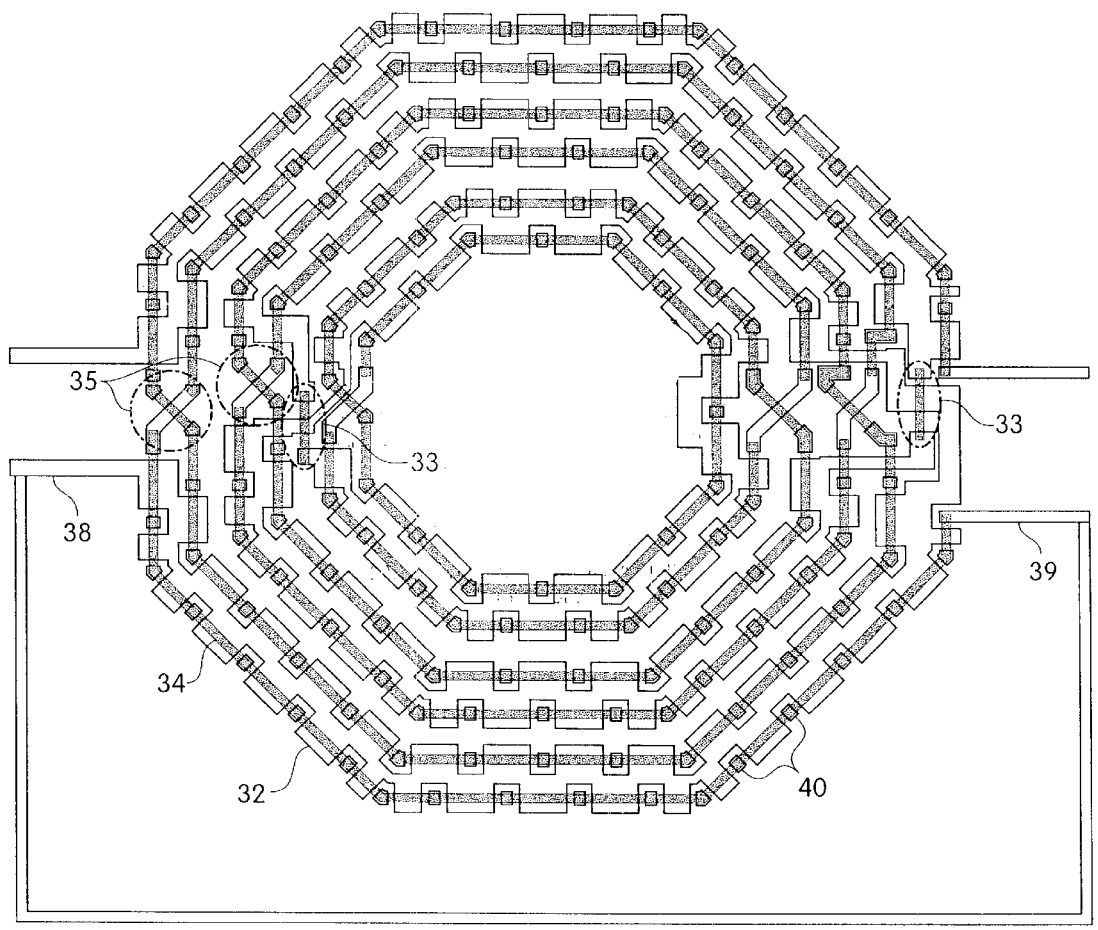
FIG. 4 shows an overhead view of an inductor described herein.

While the above discussion involved the balun transformer, it should be noted that the invention can also be embodied as an inductor. Referring to FIG. 4, the lead 38 of the primary conductor 32 is connected in series to the lead 39 of the secondary conductor 34. For the most part, the primary conductor 32 lies above the secondary conductor 34. However, the primary conductor 32 can rise to the upper layer. This can occur at the primary crossovers 33, where an electrical connection rises vertically from the lower layer, extends horizontally along the upper layer and drops down again vertically to complete the electrical connection of the primary conductor 32. The shape employed places the windings of the secondary conductor 34 on top of the windings of the primary conductor 32 on supporting posts (not shown) standing on pedestals 40. The secondary conductor 34 traverses from one winding to a nearby winding via secondary crossovers 35. In this case, the additional inductance provided by the additional turns of the windings closely coupled will greatly reduce the chip area required for a given inductance. The relative position, geometry and constituent materials of the elements in FIG. 4 are otherwise similar to those depicted in FIG. 1.

Often, increasing the number of windings in an inductor increases the inductance effects of the device. Packing more windings in a relatively small volume of space is understood to increase the inductance of an inductor, as the inductor consists of a close-pack flat coil, a toroid, or the central section of a long solenoid carrying a current i. In each case, the magnetic flux $\Phi$ is approximately the same for each winding. From Faraday's Law of Induction, the voltage drop, $\in$, across the N windings is the derivative of the number of flux linkages, N $\Phi$, with respect to time, $$\in = -d(N\Phi)/dt. \quad (1)$$

The inductance of a device is defined by $$L = -\in/(di/dt). \quad (2)$$

Substituting the expression for $\in$ implied by Equation (2) into Equation (1) and integrating with respect to time yields the result that the number of flux linkages is proportional to the current i, with the constant of proportionality, L, being the inductance, $$N\Phi = Li. \quad (3)$$

For the aforementioned coil, toroid, or solenoid, the number of flux linkages is known to be given by $$N\Phi = \mu n^2 l i A, \quad (4)$$

where $\mu$ is the permeability constant, n is the number of windings per unit length, and l and A are the length and cross-sectional area of the coil. For the aforementioned coil, toroid, or solenoid, Equations (3) and (4) imply that $$L = \mu n^2 A l.$$

Hence, it can be seen that for a given volume Al, increasing the number of windings per unit length by a factor of N increases the inductance by a factor of $N^2$. Although this derivation assumed the special geometry of a solenoid, one would generally expect that the greater the number of windings in a particular volume, the greater the inductance.

The present invention exploits this fact by making efficient use of space to include many windings in a small volume. In the present invention, the secondary conductor 34 first spirals inwards on a plane, and then spirals outwards on approximately the same plane before traversing to a different parallel plane a few microns below where this is again repeated. FIG. 4 shows two layers of conductors stacked on top of each other and connected in series. In another embodiment of the invention, instead of having just two layers stacked on top of each other, more layers are stacked next to each other. For example, by stacking two inductors of the type shown in FIG. 4, and connecting them in series, the result would be a four-layered inductor. As well, more than one dielectric can be sandwiched between any two layers. For example, instead of having mainly air as a dielectric between the lower, primary and upper, secondary conductors, it is possible to include air, silicon nitride and polyimide.

The fabrication of the transformer or inductor of the present invention is independent of the particular means or processes used to make MMIC active devices such as Field Effect Transistors (FET's), Pseudomorphic High Electron Mobility Transistors (PHEMTs), or Heterojunction Bipolar Transistors (HBTs). GaAs can be employed to make the balun compatible with other MMIC components. The GaAs forms the substrate foundation which is sliced up from an ingot that is initially approximately 0.6 millimeters thick. The surface is polished to a fine finish and is doped as required for semiconductor needs on parts of the wafer that are not proximal to the transformer; the transformer does not require doped GaAs. On top of this wafer is patterned the primary conductor 12 lying mainly in the lower layer. The primary conductor 12 is approximately one micron thick and is made of gold. On this wafer are also patterned small squares for the inclusion of the pedestals 20. The primary layer is then coated with a thin (approximately two thousand angstroms) layer of silicon nitride. In a next masking process, holes are opened up to allow material to extend from the lower layer to the upper layer containing the secondary conductor 14 made of gold, which is approximately 3 microns thick and is suspended approximately 1 micron above the silicon nitride film. The area enclosed by the transformer can be approximately one square millimeter, although the area can be made to vary according to need. Some details of the known MMIC process for fabricating electrical devices are contained in Monolithic Microwave Integrated Circuits, Robert A. Pucel, editor, IEEE Press, New York, N.Y., 1985.

While the invention has been disclosed in connection with the preferred embodiments shown and described in detail, various modifications and improvements thereon will become readily apparent to those skilled in the art. For example, although circles and octagons are mentioned by name herein, other polygons such as pentagons, hexagons, etc. are possible shapes for the windings of both the balun transformer and inductor. While three octagons of the primary winding are shown in the figures, a particular requirement might be better met using more or less as required. A higher frequency requirement would work better with a fewer number of octagons, while a substantially lower frequency requirement would work better with a larger number of octagons, which correspond to a higher value for the primary inductance of the transformer. Accordingly, the spirit and scope of the present invention are to be limited only by the following claims.

I claim:

1. A balun transformer, comprising:
   a primary conductor, wherein said primary conductor comprises at least one primary winding having at least one planar portion and at least one primary crossover portion, and wherein said at least one planar portion of said at least one primary winding lies within a first plane;
   a secondary conductor, wherein said secondary conductor comprises at least one secondary winding having at least one planar portion and at least one secondary crossover portion, and wherein said at least one planar portion of said at least one secondary winding lies within a second plane located above said first plane, and further wherein said at least one planar portion of said at least one secondary winding is concentrical;

at least one supporting post to support said at least one planar portion of said at least one secondary winding; and a dielectric comprising air disposed between said first plane and said second plane.

2. A balun transformer in accordance with claim 1, wherein said at least one planar portion of said at least one secondary winding winds along a polygonal path and wherein said at least one secondary crossover portion crosses from an outward secondary winding to an inward secondary winding.

3. A balun transformer in accordance with claim 2, wherein said at least one planar portion of said at least one secondary winding completes a one-half turn.

4. A balun transformer in accordance with claim 3, wherein said polygonal path is an octagonal path.

5. A balun transformer in accordance with claim 1, wherein said at least one planar portion of said at least one secondary winding lies approximately one micron above said at least one planar portion of said at least one primary winding.

6. A balun transformer in accordance with claim 1, wherein said primary conductor is wider than said secondary conductor.

7. A balun transformer in accordance with claim 1, wherein said primary conductor curves around said at least one supporting post to avoid said at least one supporting post.

8. A balun transformer in accordance with claim 1, further comprising:

at least one pedestal, wherein said at least one pedestal supports said at least one supporting post.

9. A balun transformer in accordance with claim 8, wherein said primary conductor curves around said at least one pedestal to avoid said at least one pedestal.

10. A balun transformer in accordance with claim 1, wherein said primary conductor and said secondary conductor are comprised of gold, and further wherein said primary conductor is approximately one micron thick and said secondary conductor is approximately three microns thick.

11. A balun transformer in accordance with claim 10, wherein said at least one planar portion of said at least one secondary winding lies approximately one micron above said at least one planar portion of said at least one primary winding.

12. A balun transformer in accordance with claim 1, wherein said dielectric further comprises one of the following: silicone nitride and polyimide.

13. A balun transformer in accordance with claim 1, wherein said at least one planar portion of said at least one secondary winding winds along a circular path and wherein said at least one secondary crossover portion crosses from an outward secondary winding to an inward secondary winding.

14. A balun transformer in accordance with claim 13, wherein said at least one planar portion of said at least one secondary winding completes a one-half turn.

15. An inductor, comprising:

a primary conductor comprising at least one planar portion and at least one primary crossover portion, wherein said at least one planar portion of said primary conductor lies within a first plane;

a secondary conductor electrically connected to said primary conductor wherein said secondary conductor comprises at least one planar portion and at least one secondary crossover portion, and wherein said at least one planar portion of said secondary conductor lies within a second plane located above said first plane, and further wherein said at least one planar portion of said secondary conductor is concentrical;

a dielectric comprising air disposed between said first plane and said second plane; and at least one supporting post to support said at least one planar portion of said secondary conductor, wherein said at least one planar portion of said primary conductor curves around said at least one supporting post to avoid said at least one supporting post, and wherein said primary conductor and said secondary conductor comprise more than one winding of a conductor.

16. An inductor in accordance with claim 15, wherein said at least one secondary crossover portion crosses from an outward planar portion of said secondary conductor to an inward planar portion of said secondary conductor and wherein said out ward and inward planar portions of said secondary conductor wind along polygonal paths.

17. An inductor in accordance with claim 16, wherein said outward planar portion of said secondary conductor and said inward planar portion of said secondary conductor complete one-half turns.

18. An inductor in accordance with claim 16, wherein said polygonal paths are octagonal.

19. An inductor in accordance with claim 15, wherein said secondary conductor is wider than said primary conductor.

20. An inductor in accordance with claim 15, wherein said at least one planar portion of said secondary conductor lies approximately one micron above said at least one planar portion of said primary conductor.

21. An inductor in accordance with claim 15, wherein said primary conductor and said secondary conductor are comprised of gold, and further wherein said primary conductor is approximately one micron thick and said secondary conductor is approximately three microns thick.

22. An inductor in accordance with claim 21, wherein said at least one planar portion of said secondary conductor lies approximately one micron above said at least one planar portion of said primary conductor.

23. An inductor in accordance with claim 15, wherein said dielectric further comprises one of the following: silicone nitride and polyimide.

24. An inductor in accordance with claim 15, wherein said at least one secondary crossover portion crosses from an outward planar portion of said secondary conductor to an inward planar portion of said secondary conductor and wherein said outward and inward planar portions of said secondary conductor wind along circular paths.

25. An inductor in accordance with claim 24, wherein said outward planar portion of said secondary conductor and said inward planar portion of said secondary conductor complete one-half turns.

26. A method for making balun transformers, comprising:

forming a primary conductor comprising at least one primary winding having at least one planar portion and at least one primary crossover portion;

locating said at least one planar portion of said at least one primary winding within a first plane;

forming a secondary conductor comprising at least one secondary winding having at least one concentrical planar portion and at least one secondary crossover portion;

locating at least one supporting post to support said at least one planar portion of said at least one secondary winding;

locating said at least one planar portion of said at least one secondary winding within a second plane located above said first plane; and providing a dielectric comprising air to reside between said first plane and said second plane.

27. A method in accordance with claim 26, wherein said at least one planar portion of said at least one secondary winding is formed along a polygonal path, and wherein said at least one secondary crossover portion connects an outward secondary winding to an inward secondary winding.

28. A method in accordance with claim 27, wherein said at least one planar portion of said at least one secondary winding completes a one-half turn.

29. A method in accordance with claim 27, wherein said polygonal path is an octagonal path.

30. A method in accordance with claim 26, wherein said at least one planar portion of said at least one secondary winding is located approximately one micron above said at least one planar portion of said at least one primary winding.

31. A method in accordance with claim 26, wherein said primary conductor is formed to curve around said at least one supporting post to avoid said at least one supporting post.

32. A method in accordance with claim 26, further comprising:

providing at least one pedestal to support said at least one supporting post.

33. A method in accordance with claim 32, wherein said primary conductor is formed to curve around said at least one pedestal to avoid said at least one pedestal.

34. A method in accordance with claim 26, wherein said dielectric further comprises one of the following: silicone nitride and polyimide.

35. A method in accordance with claim 26, wherein said at least one planar portion of said at least one secondary winding is formed along a circular path, and wherein said at least one secondary crossover portion connects an outward secondary winding to an inward secondary winding.

36. A method in accordance with claim 35, wherein said at least one planar portion of said at least one secondary winding completes a one-half turn.

37. A method for making an inductor, comprising:

forming a primary conductor comprising at least one planar portion and at least one primary crossover portion;

locating said at least one planar portion of said primary conductor within a first plane;

forming a secondary conductor comprises at least one concentrical planar portion and at least one secondary crossover portion;

providing at least one supporting post to support said at least one planar portion of said secondary conductor, wherein said at least one planar portion of said primary conductor is formed to curve around said at least one supporting post to avoid said at least one supporting post;

locating said at least one planar portion of said secondary conductor within a second plane located above said first plane;

electrically connecting said primary conductor to said secondary conductor, wherein said primary conductor and said secondary conductor comprise more than one winding of a conductor; and providing a dielectric comprising air to reside between said first plane and said second plane.

38. A method in accordance with claim 37, wherein an outward and inward planar portions of said secondary conductor are formed along polygonal paths, and wherein said at least one secondary crossover portion connects said outward planar portion of said secondary conductor to said inward planar portion of said secondary conductor.

39. A method in accordance with claim 38, wherein said outward planar portion of said secondary conductor and said inward planar portion of said secondary conductor complete one-half turns.

40. A method in accordance with claim 38, wherein said polygonal paths are octagonal paths.

41. A method in accordance with claim 37, wherein said at least one planar portion of said secondary conductor is located approximately one micron above said at least one planar portion of said primary conductor.

42. A method in accordance with claim 37, wherein said dielectric further comprises one of the following: silicone nitride and polyimide.

43. A method in accordance with claim 37, wherein an outward and inward planar portions of said secondary conductor are formed along circular paths, and wherein said at least one secondary crossover portion connects said outward planar portion of said secondary conductor to said inward planar portion of said secondary conductor.

44. A method in accordance with claim 43, wherein said outward planar portion of said secondary conductor and said inward planar portion of said secondary conductor complete one-half turns.

* * * * *